United States Patent [19]
Alves, III

[11] 3,974,438
[45] Aug. 10, 1976

[54] APPARATUS FOR INDICATING OVER-CURRENT CONDITION IN A TRANSISTOR AMPLIFIER

[75] Inventor: Joseph Ferrierea Alves, III, Milford, N.J.

[73] Assignee: RCA Corporation, New York, N.Y.

[22] Filed: Sept. 13, 1973

[21] Appl. No.: 396,790

[52] U.S. Cl.......................... 323/9; 330/2; 340/253 A
[51] Int. Cl.² ...................... G01R 19/16
[58] Field of Search ............ 323/9, 100; 330/2; 340/248 C, 249, 253 A

[56] References Cited
UNITED STATES PATENTS

| | | | |
|---|---|---|---|
| 3,068,392 | 12/1962 | Santelmann | 323/9 X |
| 3,437,928 | 4/1969 | Baker et al | 340/248 C |

*Primary Examiner*—A. D. Pellinen
*Attorney, Agent, or Firm*—H. Christoffersen; Samuel Cohen; Allen LeRoy Limberg

[57] ABSTRACT

An auxiliary transistor has its base-emitter junction serially connected with the collector-to-emitter path of a clamping transistor used to starve a power amplifier transistor of input signal drive when an over-current condition is sensed. During the over-current condition, collector current flows in the auxiliary transistor, which collector current can be used to actuate an indicator.

5 Claims, 1 Drawing Figure

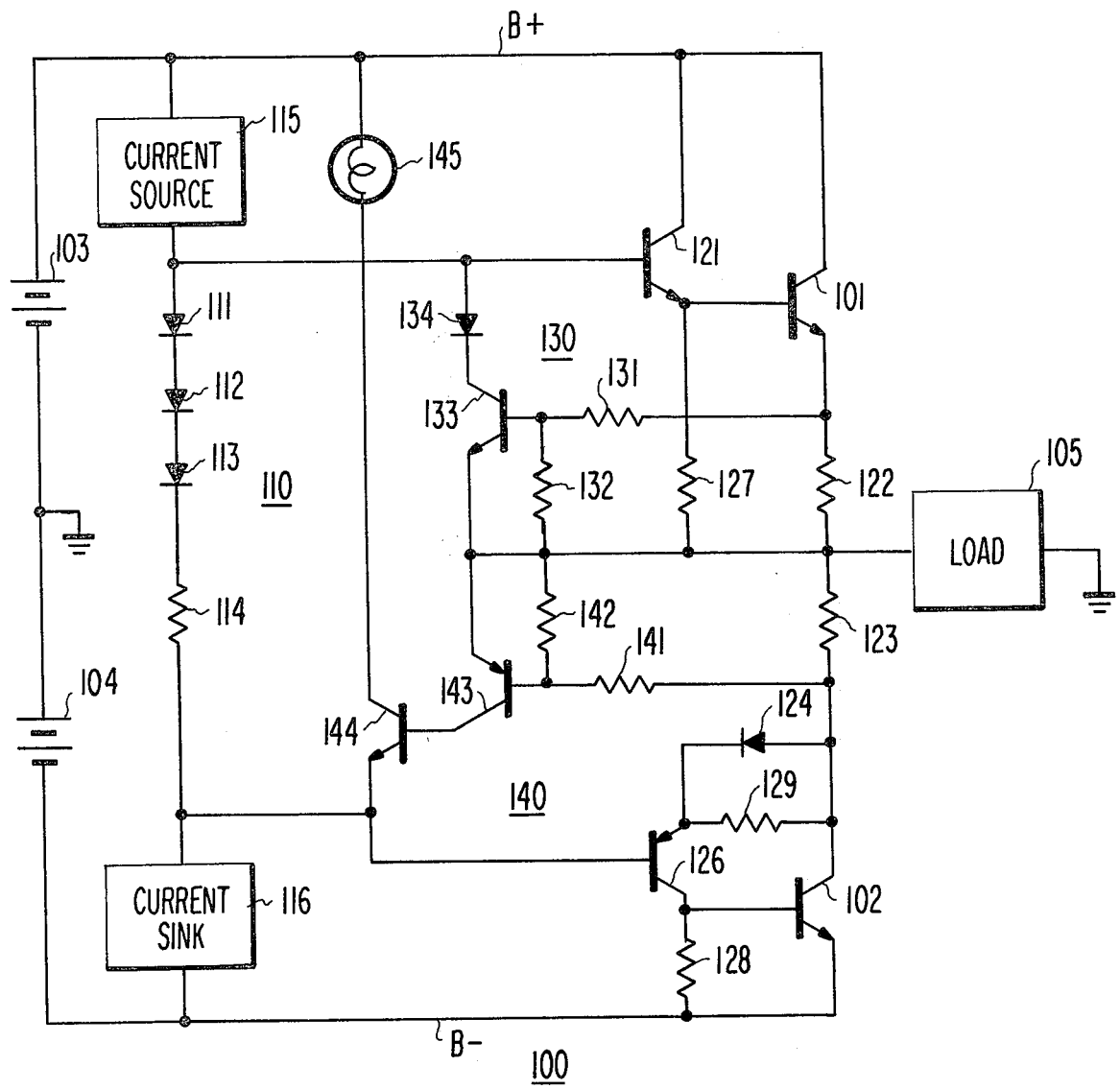

APPARATUS FOR INDICATING OVER-CURRENT CONDITION IN A TRANSISTOR AMPLIFIER

The present invention relates to apparatus for indicating when over-current protection is being afforded to a power amplifier transistor.

Transistor audio power amplifiers are often provided with over-current protection to prevent their output transistors from being destroyed by excessive internal heating. Without such protection, there is the danger of thermal destruction if the amplifier output terminals are shorted or if the amplifier is called upon to deliver substantial output signal power while overloaded.

A conventional way to afford this protection is the following. Current is delivered to the amplifier load via a series resistor across which a control potential is developed. This potential is applied directly or through a potential divider to the base-emitter junction of a clamping transistor. When the control potential exceeds the threshold potential required for substantial forward bias to the base-emitter junction of the clamping transistor—which condition obtains during the over-current condition of the amplifier output transistor—the impedance of the collector-emitter path of clamping transistor is reduced and is used to starve the input signal supplied to the output power transistor.

Conventionally, a diode is inserted between the collector electrode of the clamping transistor and the base drive circuitry of the output transistor being protected. This blocking diode is poled to be forward-biased by the collector current of the clamping transistor when it is driven into clamp, but this forward-biasing will occur only so long as the collector electrode of the clamping transistor is more positive than its base electrode. This blocking action of the blocking diode avoids the condition, encountered when driving inductive loads, that the collector-base junction of the clamping transistor may be forward-biased when the output transistor it is to protect is turned off. When a pair of output transistors are driven Class B push-pull from the same source of drive current, this condition, were it not avoided, would result in a loading of the source of drive current which would undesirably introduce distortion into the output signal.

When the load of such a transistor power amplifier is remotely located, it is desirable to be able to determine whether or not the output transistor(s) of the amplifier is (are) being afforded over-current protection. such indication may indicate accidental shorting of the amplifier output terminals or excessively high signal drive to the remote location, either of which undesirable conditions the observer of the indication may then take steps to alleviate. For example, such an indicator is useful in public address systems where a loudspeaker is located in a room different from that in which the signal source and the power amplifier are located.

The present invention is directed to an over-current protection circuit of the type hereinbefore described, in which the base-emitter junction of an auxiliary transistor is serially connected with the collector-to-emitter path of the clamping transistor to replace the blocking diode and perform its function.

The collector of such auxiliary transistor can then be used to supply current to an indicator—e.g., an incondescent lamp bulb—during the time that the over-current condition in the output transistor obtains.

The sole FIGURE of the drawing shows a quasi-complementary Class B power amplifier 100. It's output power transistors 101 and 102 are of the same conductivity type and have their collector-to-emitter paths serially connected across the series connection of B+ potential supply 103 and B− potential supply 104. Transistors 101 and 102 are each connected as common-emitter amplifiers, emitter-loaded and collector-loaded, respectively, insofar as load 105 is concerned.

(As is well known, Darlington-cascaded transistors 121 and 101 form, in effect, a composite NPN transistor having a common-emitter forward current gain substantially equal to the product of their individual common-emitter forward current gains. Cascaded transistors 126 and 102 ((and elements 124, 128, 129)) form, in effect, a composite PNP transistor having a common-emitter forward current gain substantially equal to the product of their individual common-emitter current gains, which composite PNP transistor could alternatively comprise Darlington-cascaded PNP transistors).

a series combination 110 of diodes 111, 112, 113 and resistor 114 are biased to provide a substantially constant offset potential by current flowing from a current source 115 to a current sink 116. The current source 115 supplies a current having substantially the same quiescent value as the current withdrawn by the current sink 116. Either or both of these currents is modulated to provide input current variations to the base electrodes of transistors 121 and 126.

The offset potential developed across the series combination 110 suffices to provide slight forward bias to the base-emitter junctions of transistors 121 and 101 and (via the coupling through resistors 122 and 123) to the diode 124 and the base-emitter junction of transistor 126. This slight forward bias avoids cross-over distortion during the transition from conduction in transistors 121 and 101 to conduction in transistors 126 and 102.

The parallelled diode 124 and resistor 129 provide a better match between the current gain characteristics of the composite NPN transistor formed from elements 121, 127, 101 and of the composite PNP transistors formed from elements 126, 128, 102 (and 124, 129) than would be the case were elements 124, 129 replaced by the more widely known direct connection of the emitter-electrode of transistor 126 to the collector electrode of transistor 102. Resistors 127 and 128 complete paths to dissipate stored charge in the base-emitter junctions of transistors 101 and 102, respectively, when transistors 121 and 126, respectively, are not supplying them drive current.

In operation, the amplifier 100 behaves in the following manner. When the current supplied by current source 115 exceeds the current withdrawn by current sink 116, forward bias current is applied to the composite NPN transistor comprising transistors 121 and 101 to increase its conductivity. At the same time, the PNP composite transistor comprising transistors 126 and 102 is not supplied forward bias current, so it does not supply appreciable current to the load 105. When the current demanded by the current sink exceeds that supplied by the current source 115, the excess demand biases the base-emitter junction of transistor 126 into forward conduction and causes reverse biasing of the base emitter junction of transistor 121. This excess demand current is amplified in the composite PNP transistor formed by the cascade of transistor 126 and 102, and this amplified current demand is supplied by current withdrawn from the load 105.

Overall negative feedback (not shown) from the interconnection of the amplifier 100 to its load 105 back to at least one of the current-determining elements 115 and 116 is normally employed to linearize the transconductance and/or current gains characteristic of the amplifier. At least a portion of the feedback is direct-coupled feedback which serves to equalize the quiescent components of the current supplied by source 115 and of the current withdrawn by sink 116.

During normal operation, it is expected that the currents supplied to the load 105 via the collector-emitter path of transistor 101 and a current sampling resistor 122 and the current withdrawn through current sampling resistor 123 and the collector-emitter path of transistor 102 will not be excessive. That is, there will be no over-current condition which will cause the internal heat generation within either of the transistors 101 or 102 to exceed the heat dissipation capabilities of that transistor. Under these normal conditions, the potential developed across resistor 122 in response to current supplied to the load 105 will be insufficient to cause the over-current protection circuitry 130 to divert input signal current drive from the transistor 121.

More specifically, the potential developed across resistor 122 in response to normal current flow, and subsequently divided by the resistive potential divider comprising resistors 131, 132, normally is insufficient to forward bias the base-emitter junction of the clamping transistor 133. The resistance of the collector-to-emitter path of the clamping transistor 133 will then provide an impedance to input signal current variations appreciable higher than that offered by the base-electrode of transistor 121. Accordingly, under normal operating conditions, over-current protection circuitry 130 does not affect the operation of the amplifier 100, which has been previously described.

similarly, for normal operating conditions, the current protection circuitry 140 will be inoperative to divert input signal variations from flowing in the base circuit of transistor 126. When the collector-emitter path of transistor 143 is substantially non-conductive, there is no base current supplied to auxiliary transistor 144. Consequently, there is no emitter current flow in transistor 144 and the collector-emitter path of transistor 144 is substantially non-conductive. There is, therefore, no collector current flow in transistor 144, so no current flows through the indicator device 145, shown in the FIGURE as being an incandescent lamp bulb.

When the impedance of the load 105 is sufficiently reduced, the emitter currents supplied by the transistors 101 and 102 will be of a value such that the heat generated within those transistors will exceed the capability to dissipate heat to their surrounding environment. This condition must be abated or the temperatures of the transistors 101 and 102 will rise to levels which will destroy the transistors.

During such over-current conditions, the potential developed across the current sampling resistor 122, as divided by the resistive potential divider formed from transistors 131 and 132 and applied to the base-emitter junction of clamping transistor 133, forward biases that junction. As the forward bias on the base-emitter junction of transistor 133 exceeds a certain characteristic threshold potential, the conduction of the collector-emitter path of transistor 133 is sharply increased. The transistor 133 is biased into saturation and the collector electrode of transistor 133 is clamped to a potential substantially equal to its emitter potential.

The base electrode of transistor 121, which is coupled to the collector electrode of transistor 133 by a diode 134, is clamped to a potential equal to the offset potential across the diode 134 and to the reduced collector-to-emitter potential of transistor 133. This action diverts the flow of input signal current variations from the base electrode of transistor 121 through the series combination of diode 134 and the collector-emitter path of transistor 133 during the over-current condition. The over-current protection afforded by the circuit 130 operates during excessive flows of current to the load 105.

Over-current protection circuitry 140, in which the present invention is embodied, provides similar protection against over-current being withdrawn from the load 105 through current sampling resistor 123 and the collector emitter path of transistor 102. The base-emitter junction of auxiliary transistor 144 performs a clamping action similar to that afforded by the diode 134 in the over-current protection circuitry 130.

The auxiliary transistor 144, however, exhibits current gain not to be found in a simple diode. This feature is useful when the forward current gain of PNP transistor 143 tends to be low (10 or less) as is true in the case of lateral PNP transistors in monolithic silicon integrated circuit amplifiers.

Transistor 144 becomes conductive during over-current conditions, since there is forward bias applied to its base-emitter junction during the clamping action. Its collector current demands will cause current flow through the current indicator device 145. The indicator device 145 will, therefore, signal the presence of the over-current condition.

In power amplifiers which amplify a-c signals only, over-current conditions will occur both in the portions of the amplifier supplying current to the load and the portion withdrawing current from the load. Accordingly, an indicator of one of these over-current conditions will normally suffice. In amplifiers handling signals with direct components or slowly varying a-c signal components, the diode 134 can be replaced by the base-emitter junction of a PNP transistor and a second indicator device can be connected to the collector electrode of the added PNP transistor and B- potential to indicate an over-current condition of transistor 101 directly.

While the indicator device 145 is shown as being an incandescent lamp bulb, it may instead be another type of indicator device; for example: (1) a light-emitting diode, (2) an ammeter, or (3) an electro-magnetic annunciator drop.

What is claimed is:

1. In an amplifier including an output transistor with a collector-emitter path and a base-emitter path; including means for supplying an operating potential; including means for supplying input signal currents to said output transistor base-emitter path; including means for connecting to a load circuit; including a current sensing resistor arranged to be serially connected with said means adapted for supplying an operating potential, said means for connecting to a load circuit and the collector-emitter path of said output transistor; and including a clamping transistor having a base-emitter path connected to receive at least a portion of the potential developed across said current sensing resistor and having a collector-emitter path coupled across the base-emitter path of said output transistor to starve said output transistor of said input signal currents during over-current conditions, the improvement comprising:

an auxiliary transistor having a base-emitter path connected in series combination with said clamping transistor collector-emitter path across said output transistor base-emitter path and having a collector electrode; and an indicator means having an input circuit coupling said auxiliary transistor collector electrode to said means adapted for supplying an operating potential.

2. In combination:

indicator means having a direct current conductive input circuit;

means for supplying an operating potential;

means for supplying a bias potential;

means for supplying an input signal current between first and second terminals;

a resistor for current sensing;

current amplifying means having an input circuit coupled to said means for supplying an input signal current and having an output circuit arranged to be coupled to a load via said sensing resistor and said means for supplying an operating potential; and means responsive to current of greater than a prescribed threshold value for diverting input signal from the input circuit of said current amplifying means to the input circuit of said indicator means, said diverting means having:

first and second transistors, each with an input electrode and an output electrode and a common electrode and each with current gain between its said input and said output electrodes, said input and said common electrodes of said first transistor coupled to opposite ends of said sensing resistor, said first transistor output electrode connected to said second transistor input electrode, and the common electrodes of said first and said second transistors connected respectively to the first and to the second terminals of said means for supplying an input signal current, and said means for supplying a bias potential connected in series with the input circuit of said indicator means between said first transistor and said second transistor output electrodes.

3. The combination as set forth in claim 2 wherein said indicator means comprises an indicator lamp and wherein said input circuit of said indicator means comprises the filament of said lamp.

4. In combination:

connections for a load;

indicator means having an input circuit and being responsive to current flow through its input circuit to provide an indication;

an amplifier responsive to a first portion of an input signal current applied to its input circuit for applying an output current to said connections for said load;

an over-current protection circuit responsive to output signal current of greater than a given amplitude produced by said amplifier for diverting a second portion of said input signal current away from the input circuit of said amplifier to the input circuit of said indicator means thereby reducing said first portion of said input signal, said over-current protection circuit comprising a clamping transistor and an auxiliary transistor, each having base and emitter and collector electrodes, the base-collector path of said clamping transistor connected serially with the base-emitter path of said auxiliary transistor across said input circuit, the base electrode of said clamping transistor being connected to sense said output signal current, and the collector electrode of said auxiliary transistor being connected to the input circuit of said indicator means.

5. In combination:

an amplifier output stage including an input circuit to which an input signal may be applied and an output circuit to which a load may be connected;

means in said output circuit for sensing the current applied by said output stage to said load;

a protection circuit responsive to said means for sensing current for placing a relatively low impedance path across said input circuit for substantially reducing the level of said input signal and thereby reducing the current applied to said load whenever said current applied to said load tends to exceed a predetermined level, said protection circuit comprising a transistor having a base-emitter junction and a collector electrode, said base-emitter junction forming part of said low impedance path; and a visual indicator responsive to current flow through said low impedance path for providing a visual indication that said protection circuit has been activated, said visual indicator comprising a lamp having a filament, said filament being connected in series with the collector-to-emitter path of said transistor and connections for a source of operating potential, whereby when said protection circuit is activated, said lamp is illuminated.

* * * * *